United States Patent [19]

Howard

[11] Patent Number: 4,584,687

[45] Date of Patent: Apr. 22, 1986

[54] CALIBRATED FEEDBACK FOR LASER DIODES

[75] Inventor: P. Guy Howard, Eugene, Oreg.

[73] Assignee: Optical Storage International-U.S., Minneapolis, Minn.

[21] Appl. No.: 560,288

[22] Filed: Dec. 12, 1983

[51] Int. Cl.$^4$ ............................................... H01S 3/13
[52] U.S. Cl. ........................................ 372/29; 340/707
[58] Field of Search ........................... 372/29; 329/203; 340/707

[56] References Cited

U.S. PATENT DOCUMENTS 3,290,516 12/1966 Nishizawa ........................ 329/203
4,243,972 1/1981 Toussaint ........................... 340/707

Primary Examiner—William L. Sikes
Assistant Examiner—Robert E. Wise
Attorney, Agent, or Firm—Edward P. Heller; Joseph A. Genovese

[57] ABSTRACT

Two thick film resistors calibrate the output of the feedback light detector circuit for monitoring the light power of a laser diode. The output is connected to the power control circuit for the laser diode. Calibration of the feedback output during manufacture permits replacement of the laser diode/feedback light detector combination in the field without recalibration of the power control circuit.

1 Claim, 4 Drawing Figures

THEVENIN MODEL

CALIBRATED FEEDBACK FOR LASER DIODES

BACKGROUND OF THE INVENTION

1. Field of the Invention

The invention relates generally to the field of laser diodes and more generally to laser diode feedback light detector combinations for use therein.

2. Brief Description of the Prior Art

Laser diodes have many applications. One of these is in optical disk drives. Optical disk drives are typically composed of several subsystems. Among these are a laser light pen 10 and its power control 22, 24. FIG. 1. The laser light pen 10 in turn typically comprises a laser diode 12, and a feedback light detector 18 for the purpose of monitoring the light power output of the diode.

The current developed by the detector 18 in conventional pen apparatus varies from laser diode to laser diode due to various factors, among these are the large beam dispersion angle from the laser diode rear facet 14 and mechanical tolerances in the pen optics. Conventional power control circuits compensate for these variations by providing calibration potentiometers 24, 26. As the laser diode in optical disk drives may be operted at two power levels, i.e., a read level and a write level, two corresponding potentiometers 24, 26 are provided.

When, as is sometimes the case, a laser diode wears out or otherwise malfunctions, the laser light pen is replaced as a unit. This necessitates a technician recalibrating the set points on two potentiometers, which may be a time consuming task. The procedure must be repeated each time the laser pen must be replaced.

Elimination of the recalibration step could not only save valuable time when a laser light pen must be replaced, but could also eliminate the need for a technician altogether.

SUMMARY OF THE INVENTION

The invention comprises calibrating the feedback output from the feedback light detector of a laser diode during manufacture. This permits replacement of the laser diode/feedback light detector combination without recalibration of the power control potentiometers.

DESCRIPTION OF THE PREFERRED EMBODIMENT

Figure 1:
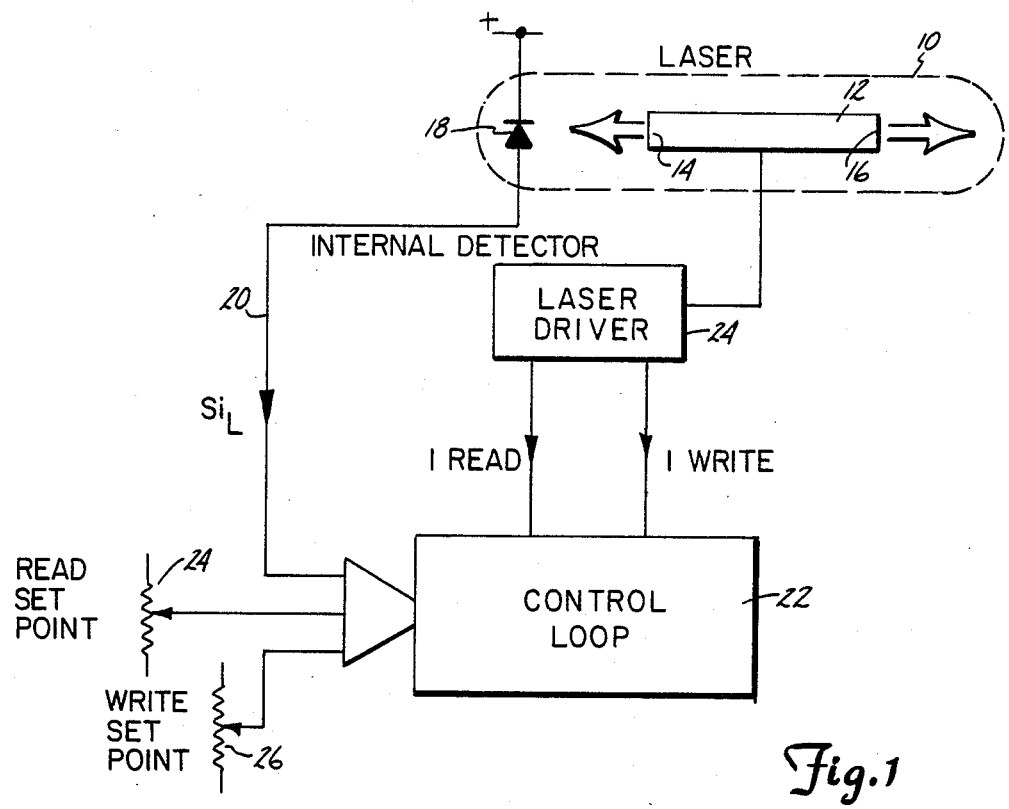
FIG. 1 show a schematic of a laser light pen feedback light detector circuit and the associated power control circuit.
Figure 2:
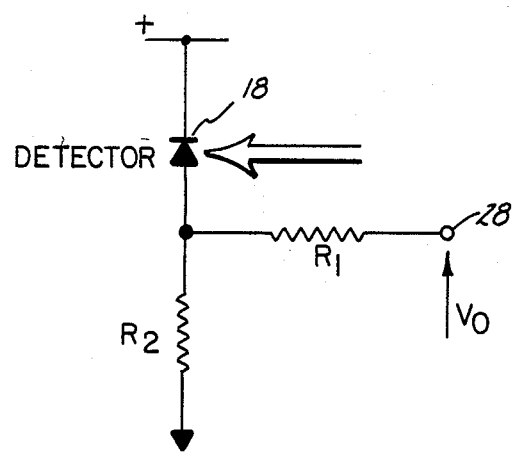
FIG. 2 shows a modification of the prior art circuit according to the present invention.

Referring to FIG. 2, two thick film resistors $R_1$ and $R_2$ are mounted in a laser diode/feedback light detector combination such as laser light pen 12 and connected to light detector 18 during manufacture. $R_2$ is connected between the light detector 18 and ground and $R_1$ is connected between the light detector 18 and output terminal 28. Output terminal 28 is connected to output line 20 when the light pen 12 is mounted in an optical disk drive (not shown) and connected to a power control loop circuit 22. After the pen 12 has been nearly fully assembled, the resistors are calibrated by trimming. Trimming may be performed using conventional techniques such as air abrasion or laser scribing.

Figure 3:
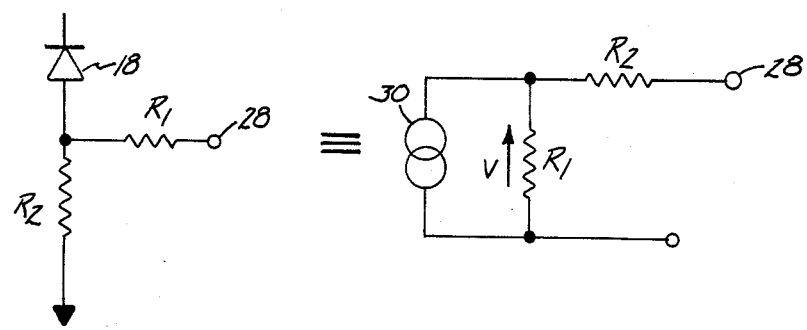
FIG. 3 shows an equivalent circuit of the circuit of FIG. 2.

The circuit of FIG. 2 can be modelled by the equivalent circuit shown in FIG. 3. In this circuit, the current generated across diode 18 is replaced by current source 30. The voltage, as measured at terminal 28, is equivalent to the voltage V developed across $R_1$ in the equivalent circuit, or $$V = IR_1$$

Figure 4:
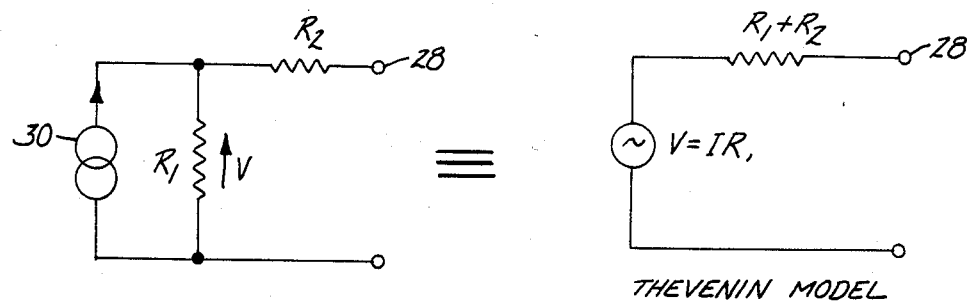
FIG. 4 shows another equivalent circuit of the circuit of FIG. 2.

The equivalent circuit of FIG. 3 can be modelled using the Thevenin voltage equivalent circuit shown in FIG. 4. There the output impedance at terminal 28 can be seen to be the sum of $R_1$ and $R_2$.

In reference to these two equivalent circuits, the circuit of FIG. 2 is calibrated as follows: First, power is applied to the laser diode 12 to produce a predetermined light power output from its front facet 16, which may be measured using calibrated light detecting apparatus. The resulting current from the feedback diode flows through resistor $R_1$ to ground. The voltage at terminal 28 is the voltage at the junction of $R_1$ and $R_2$. This voltage is measured and resistor $R_2$ is then trimmed to produce a predetermined voltage "VO" output at terminal 28. Next, $R_1$ is trimmed to produce a predetermined impedance output, i.e. $R_1 + R_2 = C$, where C is a resistance such as 50, 75 or 300 ohms, the resistance of typical transmission lines (20), COAX, twisted pair, etc.

This latter step is necessary due to the high frequency at which a laser diode 12 is modulated in typical applications, such as in optical disk drives. Unless impedance of the output is controlled, the current of the output can be expected to vary greatly between unmodulated read and modulated write operations.

The specification of the elements of the preferred embodiment should not be taken as a limitation on the scope of the appended claims, in which I claim:

I claim:

1. A method of calibrating the feedback output from the feedback light detector of the laser diode of an optical disk drive of a laser light pen comprising;
   mounting a first and a second resistor in a laser light pen;
   connecting said first resistor between the feedback light detector and ground;
   connecting said second resistor between the feedback light detector and a feedback output;
   operating the laser diode to produce a predetermined light power output;
   adjusting the resistance of the first resistor to produce a predetermined voltage at the feedback output; and
   adjusting the resistance of the second resistor to produce a predetermined impedance at the feedback output.

* * * * *